United States Patent

[11] 3,566,214

[72] Inventor Koji Usuda
Tokyo, Japan
[21] Appl. No. 722,345
[22] Filed Apr. 18, 1968
[45] Patented Feb. 23, 1971
[73] Assignee Hitachi, Ltd.
Tokyo, Japan
[32] Priority Apr. 19, 1967
[33] Japan
[31] 42/24517

[54] INTEGRATED CIRCUIT HAVING A PLURALITY OF CIRCUIT ELEMENT REGIONS AND CONDUCTING LAYERS EXTENDING ON BOTH OF THE OPPOSED COMMON MAJOR SURFACES OF SAID CIRCUIT ELEMENT REGIONS
7 Claims, 18 Drawing Figs.

[52] U.S. Cl. .......... 317/235, 317/101, 29/576
[51] Int. Cl. .......... H01l 19/00
[50] Field of Search .......... 317/235, 22, 22.1, 22.11, 101 (A)

[56] References Cited

UNITED STATES PATENTS

| | | | |
|---|---|---|---|
| 3,133,336 | 5/1964 | Marinace | 317/235 |
| 3,211,972 | 10/1965 | Kilby et al. | 317/235 |
| 3,354,354 | 11/1967 | Amick | 317/235 |
| 3,372,070 | 3/1968 | Zuk | 317/235 |
| 3,381,182 | 4/1968 | Thornton | 317/235 |
| 3,385,729 | 5/1968 | Larchian | 317/235 |
| 3,074,145 | 1/1963 | Rowe | 317/235 |
| 3,456,335 | 7/1969 | Hennings et al. | 317/235 |
| 3,475,664 | 10/1969 | Vries | 317/235 |

FOREIGN PATENTS

| | | | |
|---|---|---|---|
| 1,429,429 | 1/1966 | France | 317/235 |

OTHER REFERENCES

IBM Tech Discl Bul " Integrated Circuit Package" by Schwartz, Vol 3, No 12 May 1961 pages 26, 27

IBM Tech. Discl. Bul. " Monolithic Circuit Interconnections" by Seto et al Vol 9, No 7, Dec. 1966, pages 922—923

IBM Tech. Discl. Bul. " Monolithic Integrated Semiconductor Structure with Multilevel Conductive Interconnection Planes" by Agusta et al. Vol 9, No 7, Dec. 1966, pages 951—952

*Primary Examiner*—Jerry D. Craig
*Attorney*—Craig, Antonelli, Stewart & Hill

ABSTRACT: A method of wiring a semiconductor integrated circuit device, wherein a plurality of semiconductor circuit elements having two principal surfaces are disposed on one principal surface of an insulating substrate and mutually connected by extending connection wires along each principal surface of said circuit devices.

INVENTOR

KOJI USUDA

BY Craig & Antonelli

ATTORNEYS

INVENTOR

KOJI USUDA

BY Craig & Antonelli

ATTORNEYS

INVENTOR

KOJI USUDA

BY Craig & Antonelli

ATTORNEYS

INVENTOR

KOJI USUDA

BY Craig & Antonelli

ATTORNEYS

INVENTOR

KOJI USUDA

BY Craig & Antonelli

ATTORNEYS

Figure 1:
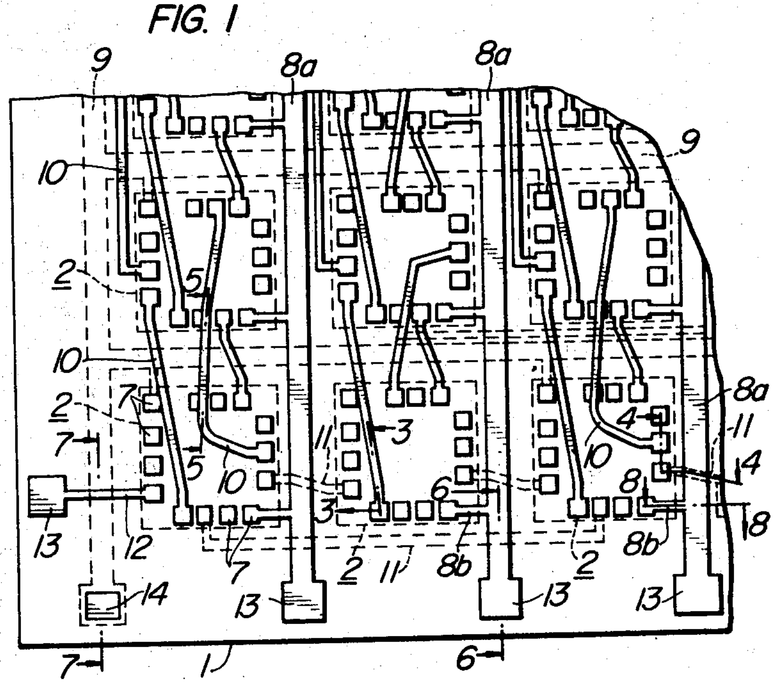

INTEGRATED CIRCUIT HAVING A PLURALITY OF CIRCUIT ELEMENT REGIONS AND CONDUCTING LAYERS EXTENDING ON BOTH OF THE OPPOSED COMMON MAJOR SURFACES OF SAID CIRCUIT ELEMENT REGIONS

This invention relates to a wiring of a semiconductor device and more particularly to an improved method of wiring of a semiconductor device composed by integrating circuit elements on a large scale.

So-called integrated circuits wherein a plurality of semiconductor circuit elements are formed on a single semiconductor circuit elements are formed on a single semiconductor substrate or an insulating support member into one body, have such features as high reliability and high density of mounting. Recently, the mounting density thereof has become more and more enhanced and a large scale integration of circuit elements of the order of one thousand has been put into practice.

In such a semiconductor integrated circuit, circuit elements are usually arranged on a plane, conductivity type determining impurity is introduced from only one principal surface of a semiconductor substrate and electrodes are provided only on said one principal surface to facilitate processing. Because of the plane constitution, wiring of circuit elements necessarily becomes of one plane type, and the circuit elements are usually connected with a metal layer extending along said one principal surface on which an insulating film is disposed.

When, the wiring structure becomes complicated, a cross connection structure, wherein diffused semiconductive layer is made to be a conducting path and a metal layer formed on an insulating layer on said diffused layer is made the other conducting path, or a cross connection structure comprising a metal layer, an insulating layer and a metal layer is employed.

Said cross connection structure is indispensable for large scale integration. However, said cross connection structure has such disadvantages as an increase of the possibility of a short circuit between the conducting paths and an increase of parasitic capacitance between the connection paths, because the conducting paths are insulated only with a thin insulating film of at most a few microns in thickness and the insulating property of the insulating film is weakened due to repeated photoetching treatment.

Accordingly, an object of this invention is to provide a novel structure of a semiconductor circuit device and a fabrication method thereof. An another object of this invention is to provide a new wiring structure in a integrated circuit device and a fabrication method thereof.

According to an embodiment of this invention, a plurality of semiconductor circuit elements having first and second principal surfaces formed into one body on an insulating support substrate are arranged planely so that said two principal surfaces compose a first and a second common planes and the circuit elements are connected with a plurality of conducting layers extending along said two common planes. In this case, PN junctions composing circuit elements are disposed on only first principal surfaces and the electrode terminals of each element are provided on said first principal surface. The conducting layers disposed along said first common plane interconnect between the predetermined terminals of said circuit elements. Some of said conducting layers along said first common plane are further connected to another conducting layer or layers extending along said second common plane in an insulated manner from said respective circuit elements by conducting means to be described in detail hereinbelow.

A semiconductor integrated circuit according to another embodiment of this invention comprises at least two circuit units including a plurality of semiconductor circuit element regions having two principal surfaces and said circuit element regions are disposed in said integrated circuit so that said principal surfaces respectively compose two common planes. Said circuit element regions are connected with a conducting layer extending along one common plane so as to form predetermined circuit units and said circuit units are connected with a conducting layer extending along the other common plane to compose a system.

Figure 2:
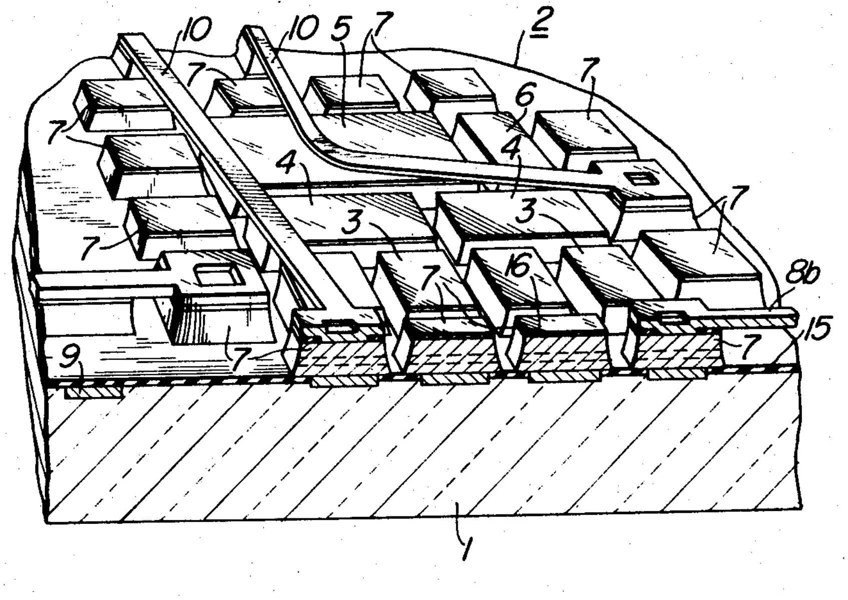
Figure 7:
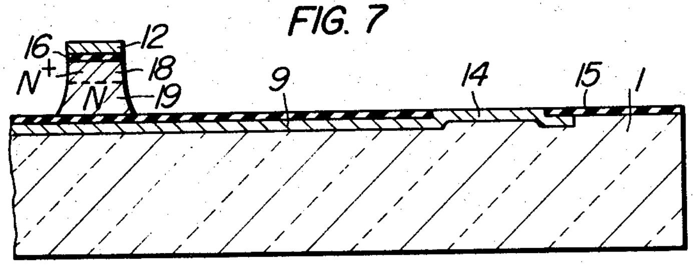
Figure 8:
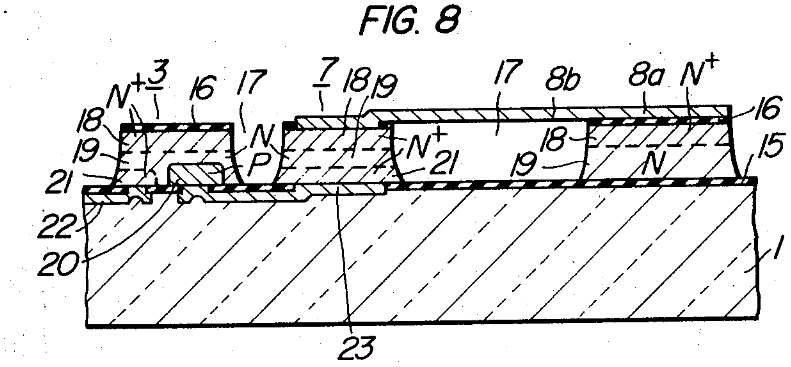
Figure 9:
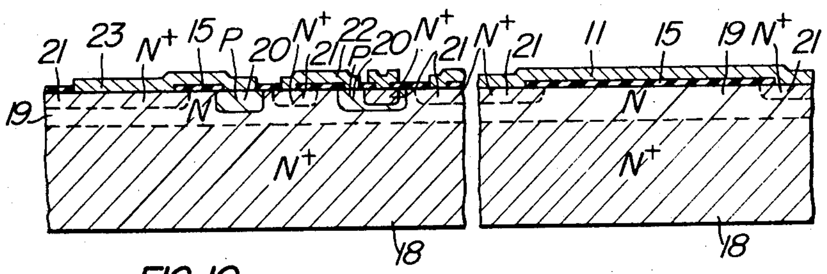
Figure 10:
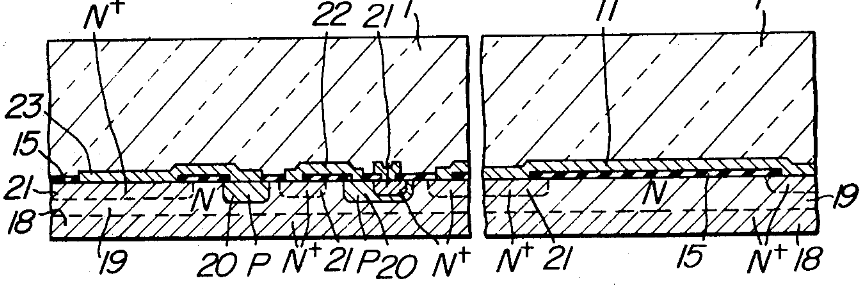
Figure 11:
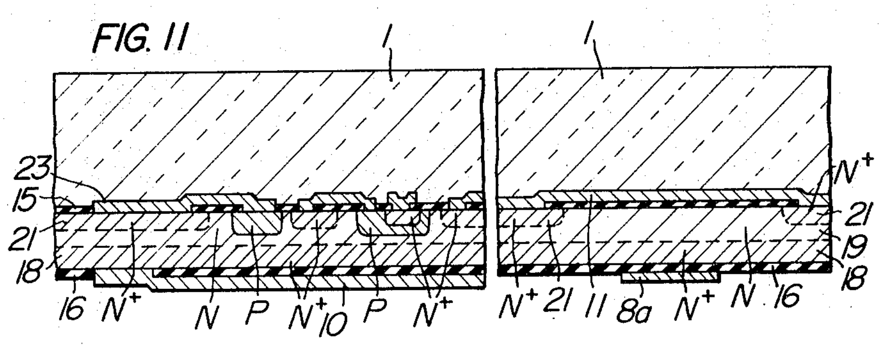
Figure 12:
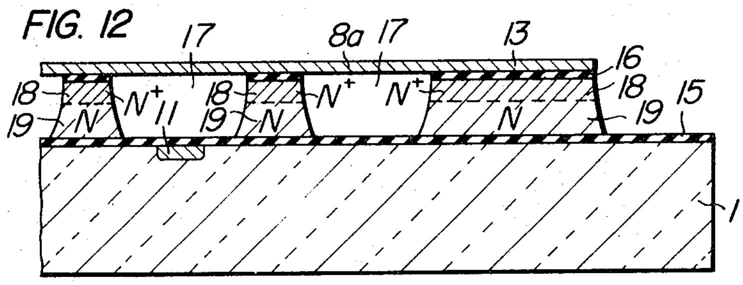
Figure 18:
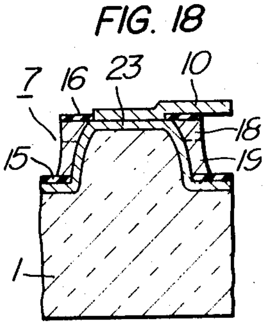

For a better understanding of this invention, the invention will be described in detail hereinbelow with reference to the accompanying drawings; wherein, FIG. 1 is a fragmentary top view of a semiconductor device according to an embodiment of this invention, FIG. 2 is a perspective diagram showing a part of a semiconductor device according to this invention in a fragmentary sectional diagram, FIGS. 3 to 8 are fragmentary sectional diagrams showing each part of a semiconductor device according to this invention, FIGS. 9 to 11 are fragmentary sectional diagrams illustrating the manufacturing process of a semiconductor device according to this invention, FIGS. 12 and 18 are sectional diagrams illustrating the partial modifications of said embodiments, and FIGS. 13 to 17 are fragmentary sectional diagrams illustrating a semiconductor device according to another embodiment of this invention.

FIG. 1 shows an top view of a part of a large scale integrated semiconductor device system and a plurality of circuit units 2 including circuit elements (not shown in FIG. 1 but in FIG. 2) formed on a substrate 1 as indicated by surrounding with broken lines. The circuit units 2 will be described in detail hereinbelow. Each of the circuit units 2 comprises a number of junction terminals 7, and the circuit units 2 are mutually connected with a plurality of metal conducting layers 10 and 11. This system further comprises a plurality of outgoing connection terminals 13 and 14, and said circuit element and said outgoing connection terminal 13 or 14 are connected by way of a junction terminal 7 corresponding to each circuit element with a metal conducting layer 8*a*, 8*b*, 9 or 12.

Such a system includes several tens of and in some cases, more than 100 circuit units as described above and they are formed into one body on a substrate 1 having a diameter of several centimeters.

FIG. 2 is a perspective diagram showing the circuit units 2 of said system shown on the lower left side of FIG. 1 in a fragmentary cross-sectional diagram. The circuit units 2 comprise a plurality of semiconductor circuit element regions 3, 4, 5 and 6 on each of which are formed circuit element or elements, and each semiconductor region is electrically insulated from each other and disposed on the insulating substrate 1 in one body. Though not shown in this figure, each circuit element includes a PN junction reaching a principal surface facing the side of the substrate 1 and the junction terminal thereof is passivated with an insulating passivation film 15. Each circuit element has an electrode or electrodes on said principal surface and mutually wired with a metal layer extending through the insulating film 15 and the substrate 1 along said principal surface to compose desired circuit units. The principal surface part of each semiconductor region on the opposite side of said principal surface described hereinabove is covered with an insulating film 16 and a metal layer 10 is arranged thereupon.

Each part of said system will be described in more detail with reference to FIGS. 3 to 8.

Figure 3:
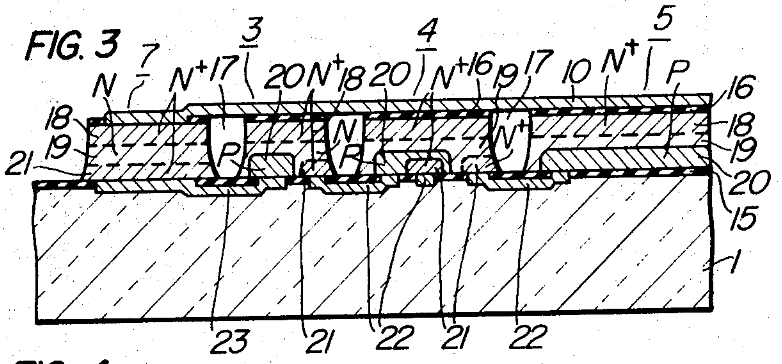

FIG. 3 is a 3—3 cross-sectional diagram of FIG. 1, wherein a junction terminal 7, a diode 3, a transistor 4 and a resistor 5 are shown from the left. One circuit unit 2 comprises a plurality of such circuit elements as the diode 3, the transistor 4, the resistor 5 and the like. Each circuit element is mutually wired with a metal conducting path 22 extending between the insulating substrate 1 and the insulating film layer 15 along the principal surface facing the substrate 1, and thus one circuit unit 2 is composed.

Said circuit unit 2 further comprises a plurality of junction terminals 7 and each circuit element is connected to the corresponding junction terminal 7 with a metal conducting layer 23 extending along said principal surface. Many such junction terminals 7 are disposed around the respective circuit unit 2 as shown in FIGS. 1 and 2. The junction terminal 7 shown in FIG. 3 is formed of a semiconductor and includes high conductivity layers 18 and 21 (regions denoted by N+) to reduce its spreading resistance.

The diode 3 is composed of high conductivity layers 18 and 21 (regions denoted by N+), a layer having a relatively high resistivity 19 (a part denoted by N) and a diffused layer 20 having a conductivity type different from that of the layer 19 (a part denoted by P).

The transistor 4 comprises a collector region consisting of high conductivity regions 18 and 21 having a first conductivity type and a high resistivity layer 19, a diffused base region 20 having a conductivity type different from said first conductivity type, and a diffused emitter region 21 formed within said diffused base region 20 and having said first conductivity type.

In the resistor 5, the P type diffused layer 20 forms a resistance path.

On the other hand, a metal layer 10 for connecting between the circuit units 2 is placed on the circuit elements 3, 4 and 5 over the insulating layer 16 and mechanically maintained with these circuit elements. One end of said metal layer 10 is electrically connected to the junction terminal 7 and further electrically connected over said semiconductor circuit element regions 3, 4 and 5 to a predetermined junction terminal possessed by the other circuit unit.

Thus, said plurality of junction terminals 7 works as means electrically to connect the metal layer extending over the one principal surface and the metal layer extending along the other principal surface.

Further, gaps 17 insulate a semiconductor region form each other electrically, and said semiconductor regions are held into one body with the insulating substrate 1.

Figure 4:
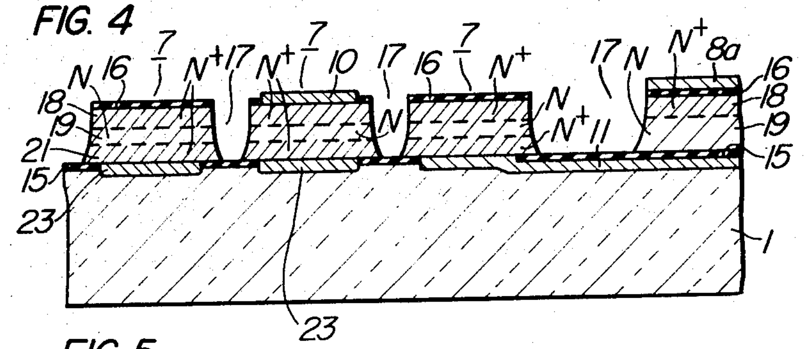

FIG. 4 shows a 4–4 cross section of FIG. 1, wherein three junction terminals 7 are shown on the left hand side and a cross connection part is shown on the right hand side. In the figure, the junction terminals 7 comprise high conductivity layers 18 and 21 to reduce the spreading resistance, and a metal electrode layer 23 is provided on the one principal surface facing the substrate 1, but the other principal surface except the necessary junction terminals is covered with an insulating film 16. Said metal electrode layer 23 is connected to a predetermined circuit element on said one principal surface, while metal layers 10 are connected to some of the junction terminals 7 through holes provided at the insulating layer 16 on the other principal surface and said metal layer 10 extends along said other principal surface and is connected to the other junction terminal (see FIG. 1).

The wiring among the circuit units 2 is done mainly with the metal conducting layer 10 extending along said other principal surface, but the variety of the wiring structure can be further increased by utilizing a metal layer 11 extending along said one principal surface facing the substrate 1. Though not shown in the figure, the metal conducting layer 11 is connected to the predetermined junction terminals 7 of the adjacent circuit units (see FIG. 1). Further, the metal conducting layer 8*a* extending along said other principal surface crosses with said metal layer 11 by way of the semiconductor layers 18 and 19 and the insulating layers 15 and 16.

As a material for the junction terminals 7, a semiconductor material is used in the embodiment described hereinabove, but a structure as shown in FIG. 18, wherein a metal layer 23 is made to protrude through a hole provided at a semiconductor material up to the other principal surface and the metal distributing layer 10 extending over the other principal surface is connected to said metal layer 23, can be employed.

Figure 5:
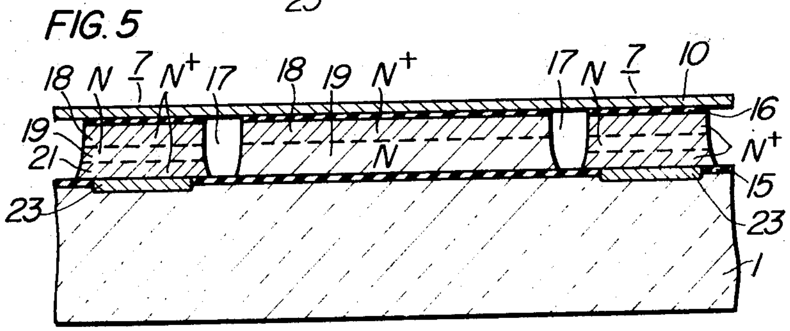

FIG. 5 shows a 5–5 cross section of FIG. 1, wherein the metal conducting layer 10 is disposed over the junction terminals 7 in insulation therefrom and mechanically maintained with said junction terminals. Said conducting layer 10 extends a relatively long distance between one of the circuit unit 2 and the other adjacent circuit unit and electrically connects between the circuit units. Semiconductor material layers 18 and 19 are left under the conducting layer 10 to increase the mechanical strength of said conducting layer. Naturally, the junction terminals 7 and said reinforcement layer are electrically insulated, for example, with the gap 17.

Figure 6:
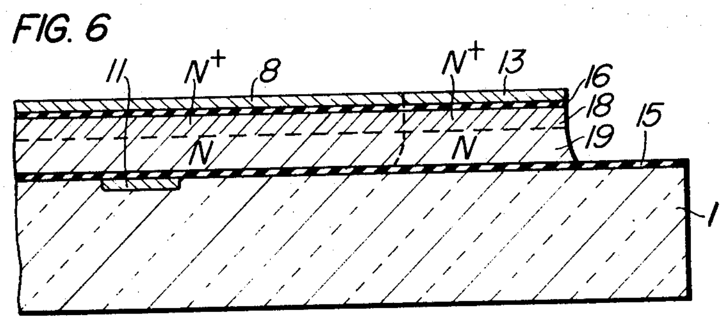

FIG. 6 shows a 6–6 cross section of FIG. 1, wherein the cross connection structure is shown on the left and an outgoing terminal 13 is shown on the right hand side. The conducting layer 8 is mechanically supported with the semiconductor layers 18 and 19, is insulated from said semiconductor layers 18 and 19 with an insulating film 16 and extends over the upper surface thereof. An outgoing connector (e.g. aluminum wire or gold wire) is connected to the part 13 where the metal layer becomes wide. The conducting layer 11 which connects between the plurality of circuit units 2 extends under said semiconductor material layers 18 and 19 in contact with the insulating substrate 1 and crosses said metal layer 8. It is profitable for reducing the parasitic capacitance of the two metal layers 8 and 11 to eliminate at least a part of the semiconductor material provided at the part of crossing and to provide the gap 17 as shown in FIG. 12, wherein the remaining semiconductor material layers 18 and 19 reinforces the metal layer 8.

FIG. 7 shows a 7–7 cross section of FIG. 1, wherein the cross connection structure is shown on the left and a lead-out terminal 14 is shown on the right. The conducting layer 9 extends along the one principal surface contacting the substrate 1 and is connected to the lead-out terminal 14. The terminal part 14 is not covered with the insulating layer 15 and a lead-out connector is connected to said exposed part. The conducting layer 12 extending along the other principal surface is mechanically supported with the semiconductor material layers 18 and 19 and crosses with the conducting layer 9 therethrough. Each of said conducting layers is insulated from the semiconductor material layers with the insulating film 15 or 16.

FIG. 8 shows an 8–8 cross section of FIG. 1. In the figure, it is shown on the right hand side that the junction terminal 7 and the metal distributing layer 8*a* are electrically connected by the metal layer 8*b* extending over the gap 17 and on the left hand side the state that one of the electrodes of the diode 3 is connected to the junction terminal 7 by the metal layer 23 extending over the substrate 1. Thus, the diode 3 is connected to the lead-out terminal 13 by the metal layer 23, the junction terminal 7 and the metal layers 8*b* and 8*a* (see FIG. 1).

The manufacturing process of such a semiconductor device is illustrated in FIGS. 9 to 11.

Firstly, as shown in FIG. 9, a semiconductor material having a high impurity concentration, e.g. N+ type silicon monocrystal substrate 18, is prepared and an N type high resistivity semiconductor layer 19 is epitaxially grown thereupon. Then, P type impurity is selectively diffused into that part of the epitaxial layer 19 where a diode, a transistor, a resistor or the like is to be formed by the known technique of selective diffusion to form a plurality of P type regions 20. Further, N type impurity is selectively introduced into that part of the N type epitaxial layer 19 whose resistivity is to be reduced and the P type regions 20 where a transistor or the like is to be formed and thus a plurality of N+ diffused regions 21 are formed.

The surfaces of the semiconductor are covered with the insulating film 15. As a material for said an insulating film 15, insulating compound, such as, silicon oxide thermally produced from the silicon substrate, silicon oxide deposited from vapor phase by thermal decomposition of organo-oxysilane, silicon nitride, aluminum oxide etc. is used.

Then, holes reaching the semiconductor are provided at the predetermined positions of said insulating film, and electrically connected metal distributing layers 9, 11, 14, 22 and 23 are formed in the predetermined regions by known photoetching techniques (9 and 14 are not shown in FIG. 9).

As a material for these distributing layers, a known metal, such as, Al, Ti, Ta, Cr, Mo etc. can be used, but it is preferable to use an infusible metal in view of the following heat treatment.

Further, a thick insulating layer or substrate 1 is formed on the side including said distributing layers as shown in FIG. 10. As a material for said insulating layer 1, a ceramic material having a relatively low sintering temperature or a glass material having a low melting point is preferred. For example, in case of ceramics, the substrate 1 is provided by uniformly adhering ceramic powder on a semiconductor wafer and sintering the same.

Then, a part of the N+ region 18 on the semiconductor substrate is etched away and made thinner as shown in FIG. 10. The thickness of the remaining semiconductor substrate is 10—20 $\mu$.

On the surface of said thinned semiconductor substrate, the insulating film 16 is formed as shown in FIG. 11. The same material as used for said film 15 can be used for the film 16. Then, holes reaching the semiconductor are provided at the predetermined positions of the film 16 and the metal layers 8*a*, 8*b*, 10, 12 or 13 connected to the semiconductor through said holes are formed on the insulating film 16 (8*b*, 12 and 13 are now shown in FIG. 11).

Finally, the semiconductor material at the predetermined position is etched away by known chemical etching etc. to form the gap 17 as shown in FIGS. 2 to 8. Thus, the circuit elements are electrically insulated from each other.

Figure 13:
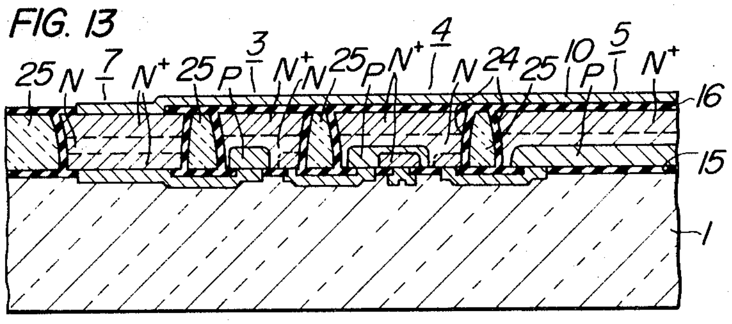

Another embodiment of this invention is shown in FIG. 13. Each part shown in FIG. 13 corresponds to each part shown in FIG. 3. In FIG. 13, however, the gap 17 shown in FIG. 3 is filled with the insulating film 24 as described hereinabove, like a silicon oxide film and a polycrystal silicon material 25 in a way to separate each element region electrically. It is also possible to fill the gap with a suitable insulating material instead of said silicon film and silicon material.

A semiconductor device of such a construction can be formed according to the process shown in FIGS. 14 to 17.

Figure 14:
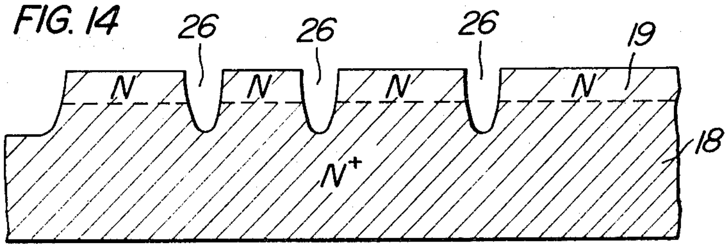
Figure 15:
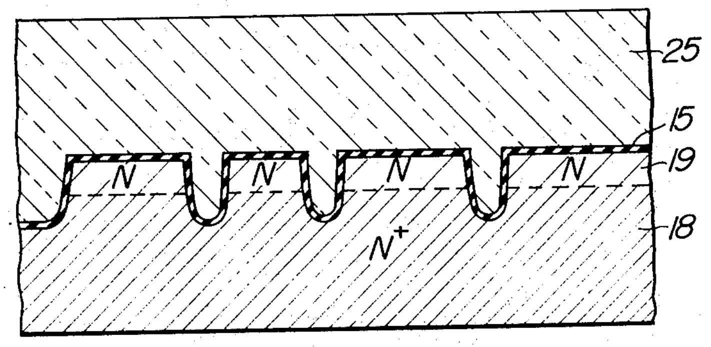
Figure 16:
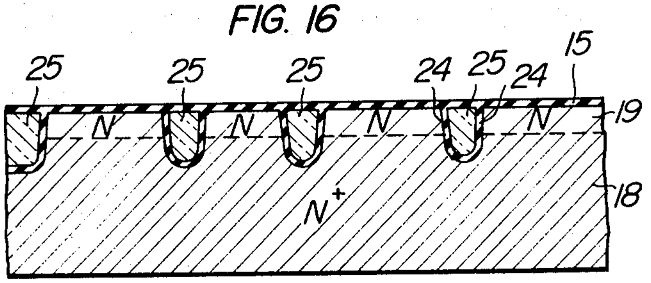

Firstly, a silicon semiconductor substrate having a high conductivity layer 18 and a high resistivity epitaxial layer 19 is prepared and a ditch 26 having a predetermined shape is formed thereupon as shown in FIG. 14. Then, a layer 15 consisting of an insulating layer including an insulating material as described hereinabove, e.g. silicon oxide or silicon nitride, is formed on the semiconductor surface where the ditch 26 is provided as shown in FIG. 15 and thereupon a layer 25 consisting of silicon polycrystal, metal or an insulator is deposited. Then, the deposited layer 25 is etched away down to the insulating layer 15 while leaving the layer 25 made of said material in the ditch 26. If necessary, an insulating layer is formed on the layer 25 as shown in FIG. 16.

Figure 17:
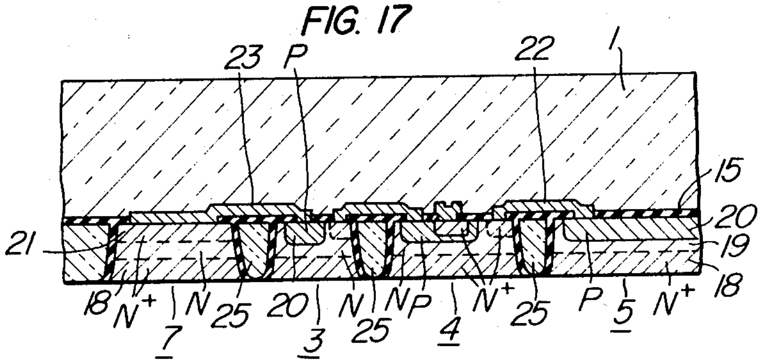

The semiconductor substrate provided in this way is subjected to the treatments explained with reference to FIG. 3 to form the circuit element 3, 4, 5, 6 or the junction element 7. The metal layer 9, 11, 14, 22 or 23 is set to the side of the one principal surface and the insulating substrate 1 is formed on said principal surface. Then, as shown in FIG. 17, the semiconductor layer 18 is etched away down to said ditch 26. By forming the insulating layer 16 on said exposed surface and wiring between the predetermined circuit units, the structure shown in FIG. 13 is obtained.

In the latter embodiment, since the part 14 shown in FIG. 1 is covered with the insulating layer made of a silicon oxide film and a polycrystal silicon material etc., it is necessary to provide the junction terminal 7 as described hereinabove and to provide the lead-out metal layer 14 thereupon.

Though this invention has been described with reference to some particular embodiments of the invention, this invention is by no means restricted thereto, but various changes and modifications can be made without departing from the spirit of this invention. For example, though N+ type silicon is used as the starting material in said embodiment, P+ type silicon, germanium or intermetallic compound can be used as well. Further, a film element like an evaporated resistor may be used as the circuit element. In this case, it is preferable to form said film element on the semiconductor principal surface where the PN junction of the semiconductor element is not exposed, i.e. on the surface remote from the insulating substrate 1 in said embodiment, by way of the insulating layer 16 so that the protection film (the insulating film 15 in said embodiment) might not be broken during the treatment like etching.

I claim:

1. A semiconductor device comprising: a plurality of circuit units, each of which includes a plurality of semiconductor regions spaced from each other, a plurality of terminal regions spaced from each other and made of a semiconductor material and a plurality of first and second conducting layers, each of said semiconductor regions having at least one circuit element, each of said semiconductor regions and said terminal regions having first and second principal surfaces composing first and second common planes extending in a substantially parallel relation with each other, said first conducting layers extending along said first common plane comprising all of the circuit interconnections for the circuit elements within each of said circuit units, said second conducting layers extending along said first common plane and connecting predetermined portions of said circuit elements with each of the corresponding terminal regions; an insulating layer covering said second principal surfaces of said semiconductor regions; and at least one third conducting layer extending along said second common plane being mechanically supported on at least one of said semiconductor regions through said insulating layer, and connecting one of the terminal regions in one of said circuit units to one of the terminal regions in another one of said circuit units, whereby the circuit units are electrically connected with each other.

2. A semiconductor device according to claim 1, further comprising a means for supporting said circuit units unitarily at said first common plane.

3. A semiconductor device according to claim 1, wherein the terminal regions are made of the same semiconductor material as said semiconductor regions.

4. A semiconductor device comprising:

a plurality of circuit units, each of which includes a plurality of semiconductor regions spaced from each other, a plurality of terminal regions spaced from each other and made of the same semiconductor material as said semiconductor regions and a plurality of first and second conducting layers, each of said semiconductor regions having at least one circuit element, each of said semiconductor regions and said terminal regions having first and second principal surfaces composing first and second common planes extending in a substantially parallel relation with each other, said first conducting layers extending along said first common plane comprising all of the circuit interconnections for the circuit elements within each of said circuit units, said second conducting layers extending along said first common plane and connecting predetermined portions of said circuit elements with each of the corresponding terminal regions; a supporting member supporting said circuit units unitarily at said first common plane; an insulating layer covering said second principal surfaces of said semiconductor regions; and at least one third conducting layer extending along said second common plane, being mechanically supported on at least one of said semiconductor regions through said insulating layer, and connecting one of the terminal regions in one of said circuit units to one of the terminal regions in another one of said circuit units, whereby the circuit units are electrically connected with each other.

5. A semiconductor device according to claim 4, wherein said circuit units are separated from each other through air gap and said third conducting layer is suspended in the air gap over said supporting member.

6. A semiconductor device according to claim 5, further comprising at least one supporting semiconductor region interposed between said third conducting layer and said supporting member to support said suspended third conducting layer, said supporting semiconductor region being electrically insulated from said semiconductor regions and said third conducting layer.

7. A semiconductor device comprising:

a plurality of circuit units spaced from each other and having first and second common planes opposed to each other, and an insulating layer covering said second common plane, each of said circuit units including a plurality of crystalline semiconductor regions disposed between said first and second common planes and each including at least one circuit element, a plurality of first conducting layers extending along said first common plane comprising all of the electrical interconnections between said circuit elements, a plurality of terminal regions disposed between said first and second common planes and made of the same semiconductor material as said semiconductor regions so as to substantially surround said semiconductor regions, a plurality of second conducting layers extending along said first common plane and each electrically connecting one of said terminal regions with the corresponding circuit element, an insulating support means supporting said circuit units unitarily at said first common plane; and at least one third conducting layer extending along said second common plane being mechanically supported on at least one of said semiconductor regions and electrically connecting said terminal regions to electrically connect between said circuit units through said terminal regions and said second conducting layers.